(12) United States Patent
Camacho et al.

(10) Patent No.: US 8,664,038 B2
(45) Date of Patent: Mar. 4, 2014

(54) INTEGRATED CIRCUIT PACKAGING SYSTEM WITH STACKED PADDLE AND METHOD OF MANUFACTURE THEREOF

(75) Inventors: Zigmund Ramirez Camacho, Singapore (SG); Arnel Senosa Trasporto, Singapore (SG); Lionel Chien Hui Tay, Singapore (SG); Jose Alvin Caparas, Singapore (SG)

(73) Assignee: Stats Chippac Ltd., Singapore (SG)

( * ) Notice: Subject to any disclaimer, the term of this patent is extended or adjusted under 35 U.S.C. 154(b) by 351 days.

(21) Appl. No.: 12/328,759

(22) Filed: Dec. 4, 2008

(65) Prior Publication Data

US 2010/0140763 A1    Jun. 10, 2010

(51) Int. Cl.
    *H01L 21/00* (2006.01)
(52) U.S. Cl.
    USPC ........... 438/106; 257/686; 257/501; 257/670; 257/690
(58) Field of Classification Search
    USPC ............... 257/501, 670, 690, 686; 438/106
    See application file for complete search history.

(56) References Cited

U.S. PATENT DOCUMENTS

| | | | | |
|---|---|---|---|---|
| 5,172,214 A * | 12/1992 | Casto | ............................ | 257/676 |
| 5,365,106 A * | 11/1994 | Watanabe | ..................... | 257/669 |
| 5,559,306 A * | 9/1996 | Mahulikar | ..................... | 174/538 |
| 6,504,236 B2 * | 1/2003 | Bissey | ........................ | 257/666 |
| 6,552,416 B1 * | 4/2003 | Foster | ........................... | 257/666 |
| 6,580,163 B2 * | 6/2003 | Poulin | ........................... | 257/678 |
| 6,781,219 B2 * | 8/2004 | Bissey | ........................... | 257/666 |
| 6,791,166 B1 * | 9/2004 | Foster | ........................... | 257/666 |
| 6,917,097 B2 * | 7/2005 | Chow et al. | ..................... | 257/666 |
| 6,979,909 B2 * | 12/2005 | Shinohara | ..................... | 257/796 |
| 6,995,459 B2 * | 2/2006 | Lee et al. | ....................... | 257/676 |
| 7,038,326 B2 * | 5/2006 | Poulin | ........................... | 257/784 |
| 7,045,907 B2 * | 5/2006 | Shinohara | ..................... | 257/796 |
| 7,101,733 B2 | 9/2006 | Huang | | |
| 7,157,292 B2 | 1/2007 | Huang | | |
| 7,166,905 B1 * | 1/2007 | Shah | ............................. | 257/666 |
| 7,202,554 B1 * | 4/2007 | Kim et al. | ..................... | 257/686 |
| 7,375,419 B2 * | 5/2008 | Mess et al. | ..................... | 257/686 |
| 7,436,048 B2 | 10/2008 | Ha et al. | | |
| 7,579,677 B2 * | 8/2009 | Ikeda et al. | ..................... | 257/676 |
| 7,671,453 B2 * | 3/2010 | Hayashi et al. | ............... | 257/668 |
| 7,911,053 B2 * | 3/2011 | Liu et al. | ....................... | 257/723 |
| 8,035,221 B2 * | 10/2011 | Cruz | ............................. | 257/704 |
| 8,067,826 B2 * | 11/2011 | Son et al. | ....................... | 257/676 |
| 8,163,604 B2 * | 4/2012 | Ong et al. | ..................... | 438/123 |
| 2002/0163015 A1 * | 11/2002 | Lee et al. | ....................... | 257/200 |
| 2004/0070059 A1 * | 4/2004 | Hori et al. | ..................... | 257/678 |
| 2004/0169262 A1 * | 9/2004 | Oliver et al. | ..................... | 257/676 |
| 2004/0256721 A1 * | 12/2004 | Difalco et al. | ................ | 257/723 |
| 2005/0067719 A1 * | 3/2005 | Hayashi et al. | ............... | 257/787 |
| 2005/0082679 A1 * | 4/2005 | Otremba | ....................... | 257/777 |
| 2005/0121756 A1 * | 6/2005 | Chow et al. | ..................... | 257/676 |
| 2005/0184364 A1 * | 8/2005 | Kim et al. | ..................... | 257/666 |
| 2006/0113643 A1 | 6/2006 | Loo et al. | | |
| 2006/0113646 A1 * | 6/2006 | Channabasappa et al. | ... | 257/678 |
| 2006/0192291 A1 * | 8/2006 | Yokozuka | ..................... | 257/776 |

(Continued)

*Primary Examiner* — Kimberly Rizkallah
*Assistant Examiner* — Caleb Henry
(74) *Attorney, Agent, or Firm* — Ishimaru & Associates LLP (57) ABSTRACT

A method of manufacture of an integrated circuit packaging system includes: forming a package paddle and a terminal adjacent to the package paddle; mounting a stack paddle over the package paddle with the stack paddle at a non-center offset with the package paddle; mounting a stack integrated circuit over the stack paddle; and encapsulating the stack integrated circuit and the stack paddle.

13 Claims, 6 Drawing Sheets

(56) References Cited

U.S. PATENT DOCUMENTS

| | | | |
|---|---|---|---|
| 2006/0261453 A1* | 11/2006 | Lee et al. | 257/676 |
| 2006/0284290 A1* | 12/2006 | Cheng | 257/676 |
| 2007/0085177 A1* | 4/2007 | Loo et al. | 257/676 |
| 2007/0087177 A1 | 4/2007 | Wu et al. | |
| 2007/0132077 A1* | 6/2007 | Choi et al. | 257/676 |
| 2007/0210422 A1* | 9/2007 | Chow et al. | 257/666 |
| 2007/0226996 A1* | 10/2007 | Mizutani et al. | 29/832 |
| 2008/0001263 A1* | 1/2008 | Dimaano et al. | 257/666 |
| 2008/0012098 A1* | 1/2008 | Chow et al. | 257/666 |
| 2008/0032456 A1* | 2/2008 | Ahn et al. | 438/124 |
| 2008/0054438 A1* | 3/2008 | Germain et al. | 257/690 |
| 2008/0073786 A1* | 3/2008 | Tanabe et al. | 257/741 |
| 2009/0065914 A1* | 3/2009 | Engl et al. | 257/676 |
| 2009/0085181 A1 | 4/2009 | Advincula, Jr. et al. | |
| 2010/0109134 A1* | 5/2010 | Jereza | 257/670 |

* cited by examiner

INTEGRATED CIRCUIT PACKAGING SYSTEM WITH STACKED PADDLE AND METHOD OF MANUFACTURE THEREOF

TECHNICAL FIELD

The present invention relates generally to an integrated circuit packaging system, and more particularly to a system for an integrated circuit packaging system with a stack paddle.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Different challenges arise from increased functionality integration and miniaturization. For example, many semiconductor (or "chip") packages having increased functionality may be made smaller but may be required to provide a large number of inputs/outputs ("I/Os"), many of which may be connected to reference sources such as digital ground, analog ground, digital supply voltage, analog supply voltage, reference voltage and so forth. Many applications require the reference sources to be electrically isolated to provide electrical performance. Numerous package approaches include mechanical and chemical means to isolate the reference sources.

Thus, a need still remains for an integrated circuit packaging system providing low cost manufacturing, improved yield, low profile, and improved reliability. In view of the ever-increasing need to save costs and improve efficiencies, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a package paddle and a terminal adjacent to the package paddle; mounting a stack paddle over the package paddle with the stack paddle at a non-center offset with the package paddle; mounting a stack integrated circuit over the stack paddle; and encapsulating the stack integrated circuit and the stack paddle.

The present invention provides an integrated circuit packaging system including: a package paddle; a terminal adjacent to the package paddle; a stack paddle over the package paddle with the stack paddle at a non-center offset with the package paddle; a stack integrated circuit over the stack paddle; and an encapsulation over the stack integrated circuit and the stack paddle.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Figure 1:
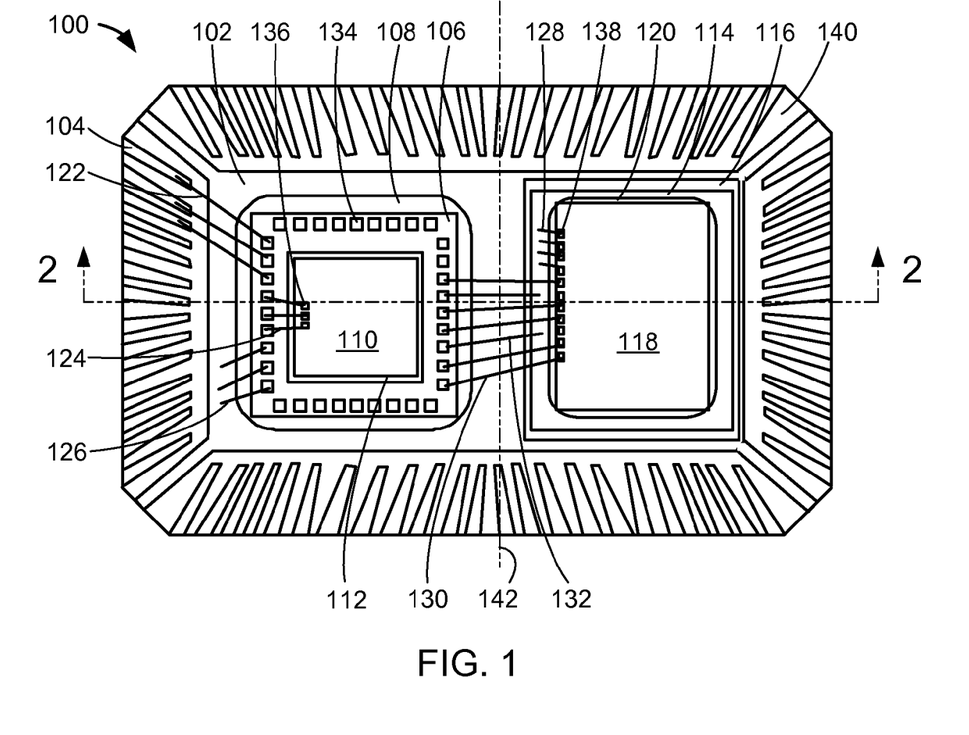
FIG. 1 is a top plan view of an integrated circuit packaging system in a first embodiment of the present invention.

Referring now to FIG. 1, therein is shown a top plan view of an integrated circuit packaging system 100 in a first embodiment of the present invention. The top plan view is shown without a top portion of an encapsulation 140, such as a cover including epoxy molding compound. The top plan view depicts a package paddle 102, such as a die-attach paddle or a die-attach pad, and terminals 104, such as leads, adjacent to the package paddle 102.

A first base integrated circuit 106, such as an integrated circuit die, can be over the package paddle 102 in a non-center offset configuration from a center 142 of the package paddle 102. For example, the first base integrated circuit 106 can represent a static random access memory (SRAM). The center 142 is depicted as a dashed line representing a center liner of the package paddle 102. The non-center offset configuration for the first base integrated circuit 106 is defined as the first base integrated circuit 106 not over the center 142.

A first adhesive 108, such as a conductive epoxy or a die attach adhesive, can attach the first base integrated circuit 106 and the package paddle 102. For example, the first adhesive 108 can provide bulk grounding to the first base integrated circuit 106 with the package paddle 102 functioning as a ground plane.

The first base integrated circuit 106 can include first base interconnect contacts 134, such as bonding pads, at a periphery of the first base integrated circuit 106. A second base integrated circuit 110, such as an integrated circuit die, can mount over the first base integrated circuit 106, with a second adhesive 112, such as a non-conductive adhesive.

For example, the second base integrated circuit 110 can represent a logic controller chip. The second base integrated circuit 110 can include second base interconnect contacts 136, such as bonding pads. A portion of the second base interconnect contacts 136 is depicted for clarity.

For illustrative purposes, the integrated circuit packaging system 100 is shown with the first base interconnect contacts 134 at the periphery of the first base integrated circuit 106, although it is understood that the integrated circuit packaging system 100 can have a different configuration with the first base interconnect contacts 134. For example, the integrated circuit packaging system 100 can have an array or multiple rows of the first base interconnect contacts 134. The rows can be staggered or in-line, as examples.

Also for illustrative purposes, the integrated circuit packaging system 100 is shown with one row of the second base interconnect contacts 136, although it is understood that the integrated circuit packaging system 100 can have a different configuration with the second base interconnect contacts 136. For example, the integrated circuit packaging system 100 can have multiple rows of the second base interconnect contacts 136. The rows can be staggered or in-line, as examples.

A stack paddle 114 can be over the package paddle 102 with a first stack adhesive 116, such as a non-conductive adhesive, in between. The first stack adhesive 116 can electrically isolate the stack paddle 114 and the package paddle 102. The stack paddle 114 is defined as a paddle mounted over and electrically isolated with the package paddle 102. The stack paddle 114 can be at a non-center offset with the package paddle 102. The non-center offset for the stack paddle 114 is defined as having the stack paddle 114 not over the center 142. A stack integrated circuit 118, such as an integrated circuit die, can be over the stack paddle 114, with a second stack adhesive 120, such as a conductive epoxy or a die-attach adhesive, in between. For example, the stack integrated circuit 118 can represent a memory chip.

For example, the second stack adhesive 120 can provide bulk grounding to the stack integrated circuit 118 with the stack paddle 114. The stack integrated circuit 118 can include one row of stack interconnect contacts 138, such as bonding pads. A portion of the stack interconnect contacts 138 is depicted for clarity.

For illustrative purposes, the integrated circuit packaging system 100 is shown with one row of the stack interconnect contacts 138, although it is understood that the integrated circuit packaging system 100 can have a different configuration with the stack interconnect contacts 138. For example, the integrated circuit packaging system 100 can have multiple rows of the stack interconnect contacts 138. The rows can be staggered or in-line, as examples.

The integrated circuit packaging system 100 can include first interconnects 122, such as bond wires, which can connect the terminals 104 and the first base integrated circuit 106 at the first base interconnect contacts 134. Not all the first interconnects 122 are shown for clarity.

The integrated circuit packaging system 100 can include second interconnects 124, such as bond wires, which can connect the first base interconnect contacts 134 and the second base interconnect contacts 136. Not all the second interconnects 124 are shown for clarity.

The integrated circuit packaging system 100 can include third interconnects 126, such as bond wires, which can connect the package paddle 102 and the first base interconnect contacts 134. For example, the third interconnects 126 can function as ground wires for the first base integrated circuit 106. Not all the third interconnects 126 are shown for clarity.

The integrated circuit packaging system 100 can include fourth interconnects 128, such as bond wires, which can connect the stack paddle 114 and the stack integrated circuit 118 at the stack interconnect contacts 138. For example, the fourth interconnects 128 can function as ground wires for the stack integrated circuit 118 with the stack paddle 114 connected to the terminals 104 that are tied to ground. Not all the fourth interconnects 128 are shown for clarity.

The integrated circuit packaging system 100 can include fifth interconnects 130, such as bond wires, which can connect the first base integrated circuit 106 and the stack integrated circuit 118. For example, the fifth interconnects 130 can function as input/output (I/O) signals between the first base integrated circuit 106 and the stack integrated circuit 118. Not all the fifth interconnects 130 are shown for clarity.

The integrated circuit packaging system 100 can include sixth interconnects 132, such as bond wires, which can connect the first base integrated circuit 106 and the stack paddle 114. For example, the sixth interconnects 132 can provide ground shielding of data input/output signals carried on the fifth interconnects 130. The sixth interconnects 132 can minimize the number of reference, such as ground, pin assignments for the terminals 104.

It has been discovered that the present invention provides integrated circuit packaging system having numerous reference contact options while minimizing the footprint and pin count. An electrical isolation of reference sources by mounting the stack paddle in a non-center offset configuration over the package paddle allows formation of multiple reference planes, such as ground, power, analog ground, analog power, digital ground, or digital power, in the integrated circuit packaging system.

It has also been discovered that the present invention provides integrated circuit packaging system having high density input/output (I/O) and reduces wire sweeps. The non-center offset configuration allows internal connection between the integrated circuits over the stack paddle and over the package paddle. The non-center offset configuration shortens the wire length between the base integrated circuit and the terminals, between the stack integrated circuit and the terminals, between the base integrated circuits and the stack integrated circuits thereby reducing wire sweeps.

Figure 2:
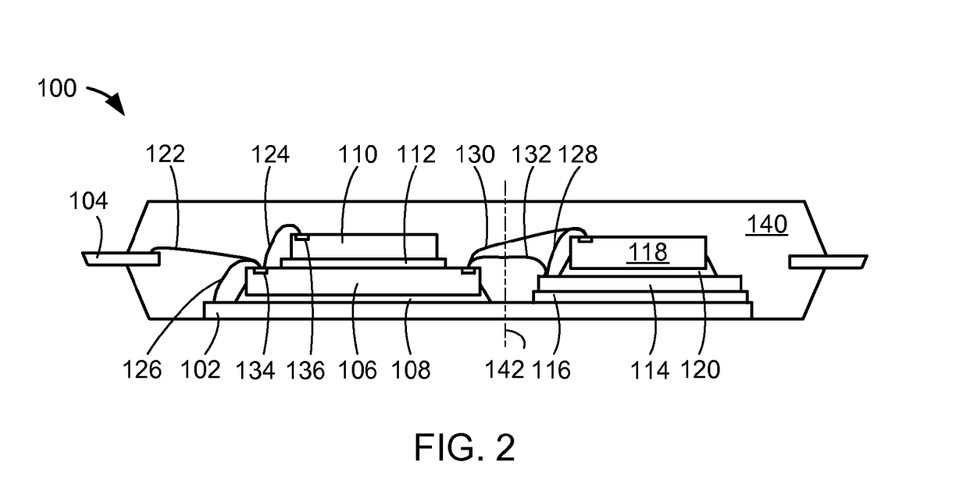
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The cross-sectional view depicts the package paddle 102 and the terminals 104, such as leads, over a plane of the package paddle 102. The first base integrated circuit 106 can be over the package paddle 102 in the non-center offset configuration from the center 142 of the package paddle 102. The center 142 is depicted as a dashed line representing the center line of the package paddle 102.

The first adhesive 108 can attach the first base integrated circuit 106 and the package paddle 102. The first base integrated circuit 106 can include the first base interconnect contacts 134 at the periphery of the first base integrated circuit 106.

The second base integrated circuit 110 can mount over the first base integrated circuit 106 with the second adhesive 112. The second base integrated circuit 110 can include the second base interconnect contacts 136.

The stack paddle 114 can be over the package paddle 102 with the first stack adhesive 116 in between. The first stack adhesive 116 can electrically isolate the stack paddle 114 and the package paddle 102. The stack paddle 114 can be at a non-center offset with the package paddle 102. The stack integrated circuit 118 can be over the stack paddle 114 with the second stack adhesive 120 in between.

The integrated circuit packaging system 100 can include the first interconnects 122 connecting the terminals 104 and the first base integrated circuit 106. The second interconnects 124 can connect the first base integrated circuit 106 and the second base integrated circuit 110. The third interconnects 126 can connect the package paddle 102 and the first base integrated circuit 106.

The fourth interconnects 128 can connect the stack paddle 114 and the stack integrated circuit 118. The fifth interconnects 130 can connect the first base integrated circuit 106 and the stack integrated circuit 118. The sixth interconnects 132 can connect the first base integrated circuit 106 and the stack paddle 114.

The integrated circuit packaging system 100 includes the encapsulation 140 molded directly on the package paddle 102, the first base integrated circuit 106, the second base integrated circuit 110, the stack integrated circuit 118, and the stack paddle 114. The encapsulation 140 also covers the first interconnects 122, the second interconnects 124, the third interconnects 126, the fourth interconnects 128, the fifth interconnects 130, and the sixth interconnects 132. The package paddle 102 can have a bottom surface exposed from and coplanar with the encapsulation 140.

It has further been discovered that the present invention provides integrated circuit packaging system having stability with the stack paddle mounted over the package paddle at a non-center offset with the package paddle. The stability can prevent pad tilt which may produce flash. Pad tilt can also contribute to smashed bonds which may affect bond integrity. Thus, the present invention provides reliability in the manufacture of an integrated circuit packaging system.

Figure 3:
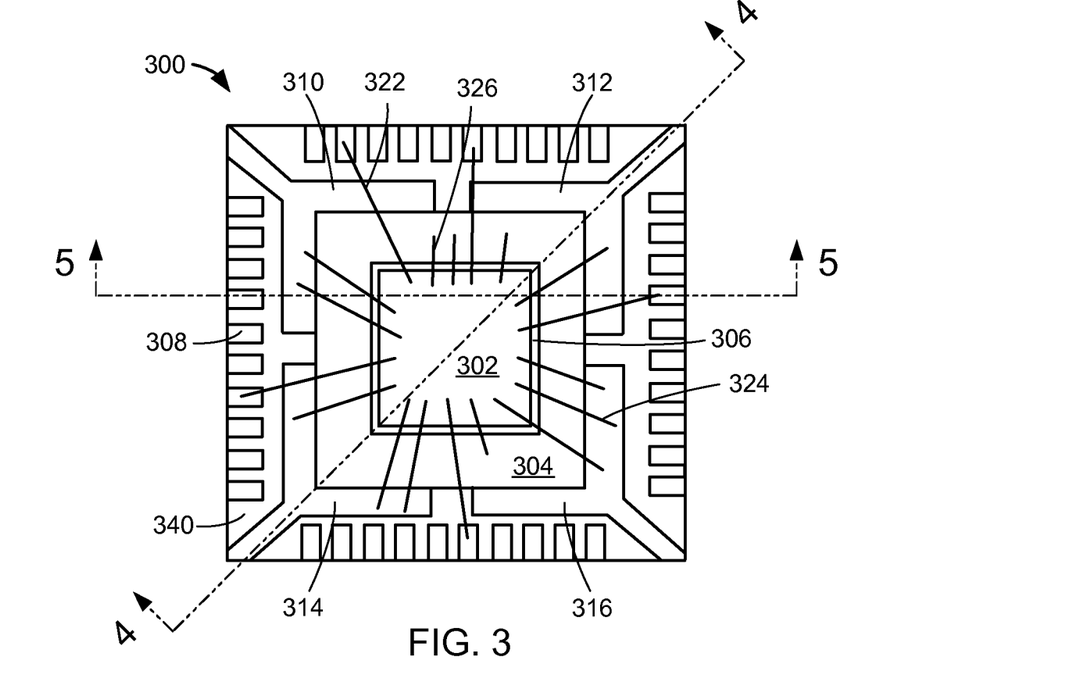
FIG. 3 is a top plan view of an integrated circuit packaging system in a second embodiment of the present invention.

Referring now to FIG. 3, therein is shown a top plan view of an integrated circuit packaging system 300 in a second embodiment of the present invention. The top plan view depicts the integrated circuit packaging system 300 without a top portion of an encapsulation 340, such as a cover including an epoxy molding compound.

The integrated circuit packaging system 300 includes a first package paddle 310, a second package paddle 312, a third package paddle 314, and a fourth package paddle 316, with terminals 308, such as terminal pads. The terminals 308 can be adjacent to the first package paddle 310, the second package paddle 312, the third package paddle 314, and the fourth package paddle 316.

The first package paddle 310, the second package paddle 312, the third package paddle 314, and the fourth package paddle 316 can be isolated from one another to provide potentially different reference sources for the integrated circuit packaging system 300. For example, the first package paddle 310, the second package paddle 312, the third package paddle 314, and the fourth package paddle 316 can be provide digital ground, analog ground, digital supply voltage, analog supply voltage, or reference voltage.

A stack paddle 304 can be over the first package paddle 310, the second package paddle 312, the third package paddle 314, and the fourth package paddle 316 with the stack paddle 304 at a non-center offset from the first package paddle 310, the second package paddle 312, the third package paddle 314, and the fourth package paddle 316. The non-center offset for the stack paddle 304 is defined as the stack paddle 304 not at a center and overhanging each of the first package paddle 310, the second package paddle 312, the third package paddle 314, and the fourth package paddle 316.

An integrated circuit 302, such as an integrated circuit die, can be over the stack paddle 304 with a second stack adhesive 306, such as a conductive epoxy or a die attach adhesive, in between. For example, the second stack adhesive 306 can provide bulk grounding to the integrated circuit 302 with the stack paddle 304 functioning as a ground plane.

First interconnects 322, such as bond wires or ribbon bond wires, can connect the integrated circuit 302 and the terminals 308. Second interconnects 324, such as bond wire or ribbon bond wires, can connect the integrated circuit 302 with the first package paddle 310, the second package paddle 312, the third package paddle 314, or the fourth package paddle 316. Third interconnects 326, such as bond wires or ribbon bond wires, can connect the integrated circuit 302 and the stack paddle 304. Not all the first interconnects 322, the second interconnects 324, and the third interconnects 326 are shown for clarity.

Figure 4:
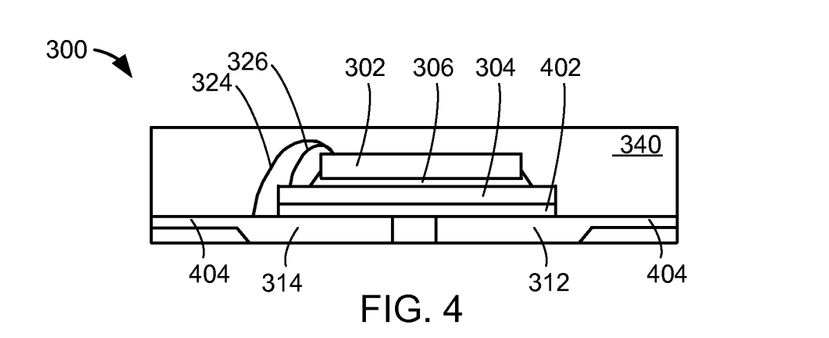
FIG. 4 is a cross-sectional view of the integrated circuit packaging system along line 4-4 of FIG. 3.

Referring now to FIG. 4, therein is shown a cross-sectional view of the integrated circuit packaging system 300 along line 4-4 of FIG. 3. The integrated circuit 302 can be over the stack paddle 304 with the second stack adhesive 306 in between. The integrated circuit packaging system 300 includes a first stack adhesive 402, such as a non-conductive adhesive, in between the stack paddle 304 and the first package paddle 310 of FIG. 3, the second package paddle 312, the third package paddle 314, and the fourth package paddle 316 of FIG. 3. The stack paddle 304 is mounted over and electrically isolated with the first package paddle 310 of FIG. 3, the second package paddle 312, the third package paddle 314, and the fourth package paddle 316 of FIG. 3.

For example, the first stack adhesive 402, such as a non-conductive adhesive, can provide a reference source with the stack paddle 304 electrically isolated from the first package paddle 310, the second package paddle 312, the third package paddle 314, and the fourth package paddle 316. The first package paddle 310, the second package paddle 312, the third package paddle 314, and the fourth package paddle 316 can provide an electrically isolated first reference source, an electrically isolated second reference source, an electrically isolated third reference source, and an electrically isolated fourth reference source, respectively.

The second interconnects 324 can connect the integrated circuit 302 and the third package paddle 314. The third interconnects 326 can connect the integrated circuit 302 and the stack paddle 304.

The encapsulation 340 can be over the first package paddle 310, the second package paddle 312, the third package paddle 314, and the fourth package paddle 316. The first package paddle 310, the second package paddle 312, the third package paddle 314, and the fourth package paddle 316 each includes a paddle extension 404 that is within the encapsulation 340. The paddle extension 404 can function as a mold lock securing the first package paddle 310, the second package paddle 312, the third package paddle 314, and the fourth package paddle 316 in the encapsulation 340.

The encapsulation 340 can also expose the first package paddle 310, the second package paddle 312, the third package paddle 314, and the fourth package paddle 316. The encapsulation 340 can fill a space between the first package paddle 310, the second package paddle 312, the third package paddle 314, and the fourth package paddle 316.

Figure 5:
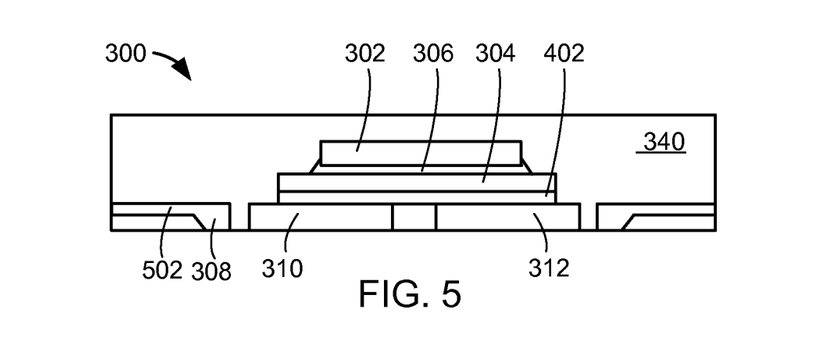
FIG. 5 is a cross-sectional view of the integrated circuit packaging system along line 5-5 of FIG. 3.

Referring now to FIG. 5, therein is shown a cross-sectional view of the integrated circuit packaging system 300 along line 5-5 of FIG. 3. The integrated circuit 302 can be over the stack paddle 304 with the second stack adhesive 306 in between. The terminals 308 can be adjacent to the first package paddle 310, the second package paddle 312, the third package paddle 314 of FIG. 3, and the fourth package paddle 316 of FIG. 3.

The integrated circuit packaging system 300 includes the first stack adhesive 402 between the stack paddle 304 and the first package paddle 310, the second package paddle 312, the third package paddle 314, and the fourth package paddle 316. Each of the terminals 308 includes a terminal extension 502. The terminal extension 502 can be within the encapsulation 340 functioning as a mold lock. The encapsulation 340 can expose the terminals 308.

Figure 6:
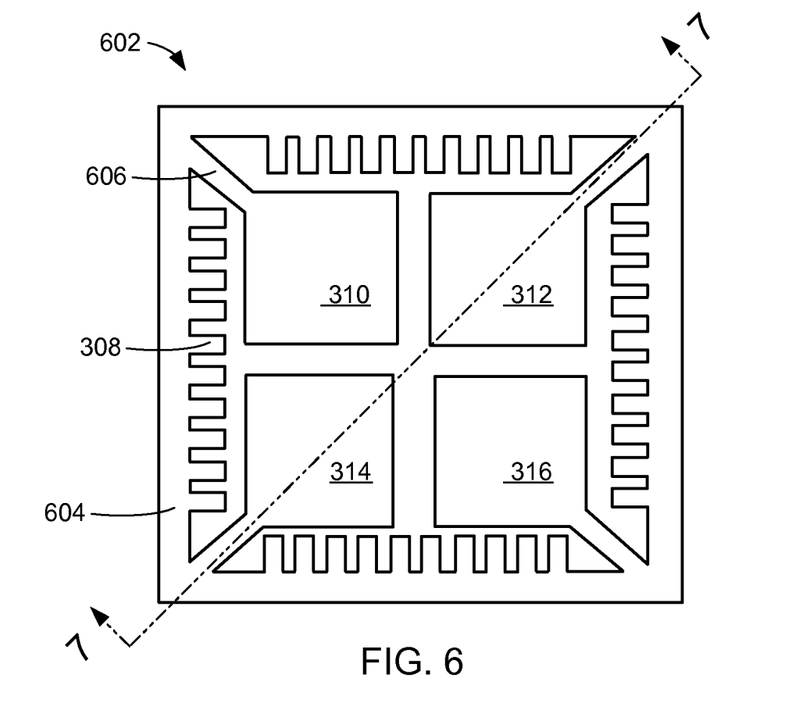
FIG. 6 is a top view of a portion of a lead frame.

Referring now to FIG. 6, therein is shown a top view of a portion of a lead frame 602. The lead frame 602 can be an un-singulated lead frame. The lead frame 602 includes the first package paddle 310, the second package paddle 312, the third package paddle 314, and the fourth package paddle 316.

The terminals 308 can extend from dam bars 604 of the lead frame 602. Tie bars 606 connect the dam bars 604 and the first package paddle 310, the second package paddle 312, the third package paddle 314, and the fourth package paddle 316.

Figure 7:
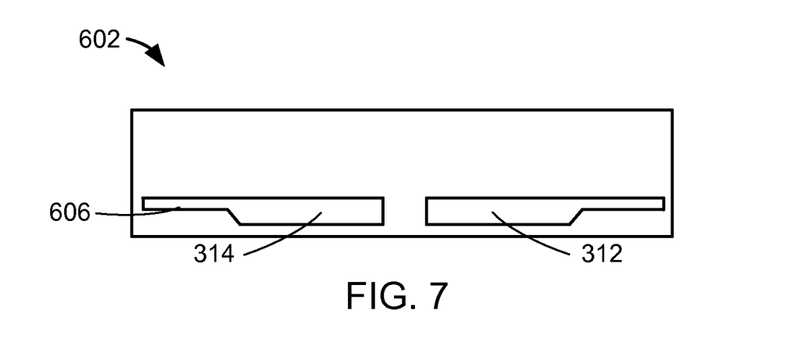
FIG. 7 is a cross-sectional view of the lead frame along line 7-7 of FIG. 6.

Referring now to FIG. 7, therein is shown a cross-sectional view of the lead frame 602 along line 7-7 of FIG. 6. The cross-sectional view depicts an isolation of the second package paddle 312 and the third package paddle 314. The tie bars 606 can extend from the second package paddle 312 and the third package paddle 314.

Figure 8:
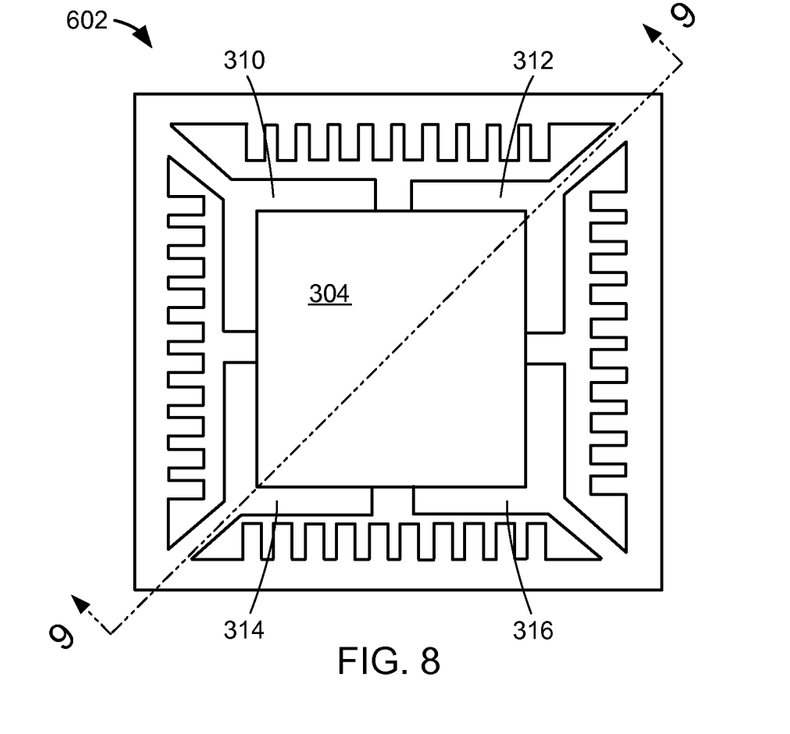
FIG. 8 is the structure of FIG. 6 in mounting the stack paddle.

Referring now to FIG. 8, therein is shown the structure of FIG. 6 in mounting the stack paddle 304. The stack paddle 304 can be mounted over the first package paddle 310, the second package paddle 312, the third package paddle 314, and the fourth package paddle 316 in the non-center offset configuration. The first package paddle 310, the second package paddle 312, the third package paddle 314, and the fourth package paddle 316 are attached to the lead frame 602.

Figure 9:
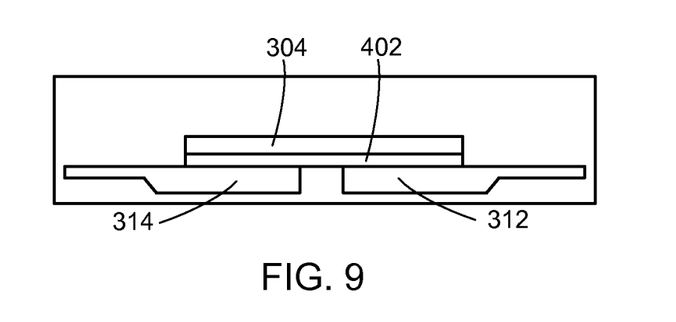
FIG. 9 is a cross-sectional view along line 9-9 of FIG. 8.

Referring now to FIG. 9, therein is shown a cross-sectional view along line 9-9 of FIG. 8. The cross-sectional view depicts the first stack adhesive 402 between the stack paddle 304 and the second package paddle 312 and the third package paddle 314.

Figure 10:
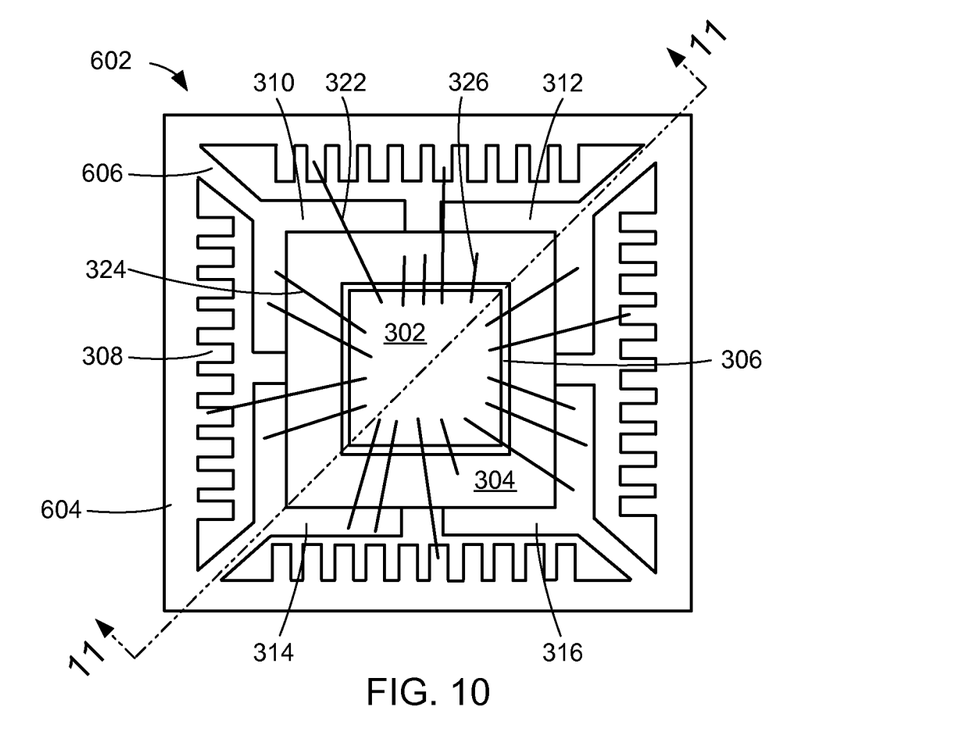
FIG. 10 is the structure of FIG. 8 in connecting the integrated circuit.

Referring now to FIG. 10, therein is shown the structure of FIG. 8 in connecting the integrated circuit 302. The integrated circuit 302 can be attached to the stack paddle 304 with the second stack adhesive 306.

The first interconnects 322 can connect the integrated circuit 302 and the terminals 308. The second interconnects 324 can connect the integrated circuit 302 with the first package paddle 310, the second package paddle 312, the third package paddle 314, or the fourth package paddle 316. The third interconnects 326 can connect the integrated circuit 302 and the stack paddle 304.

The structure with the integrated circuit 302 connected to the first package paddle 310, the second package paddle 312, the third package paddle 314, and the fourth package paddle 316 can undergo an encapsulating process for forming the encapsulation 340 of FIG. 3. The encapsulating process can be performed by a number of processes. For example, injection molding, transfer molding, or compression molding can form the encapsulation 340.

The molded structure can undergo a singulation process removing the terminals 308 from the dam bars 604. The singulation process can also form the paddle extension 404 from the tie bars 606 forming the integrated circuit packaging system 300 of FIG. 3.

Figure 11:
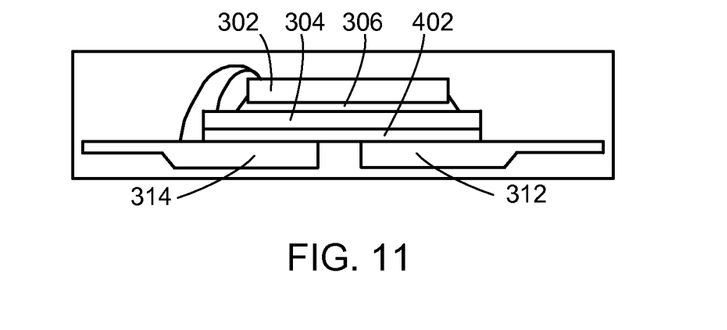
FIG. 11 is a cross-sectional view along line 11-11 of FIG. 10.

Referring now to FIG. 11, therein is shown a cross-sectional view along line 11-11 of FIG. 10. The integrated circuit 302 can mounted over the stack paddle 304 with the second stack adhesive 306. The first stack adhesive 402 can be between the stack paddle 304 and the first package paddle 310 of FIG. 10, the second package paddle 312, the third package paddle 314, and the fourth package paddle 316 of FIG. 10.

Figure 12:
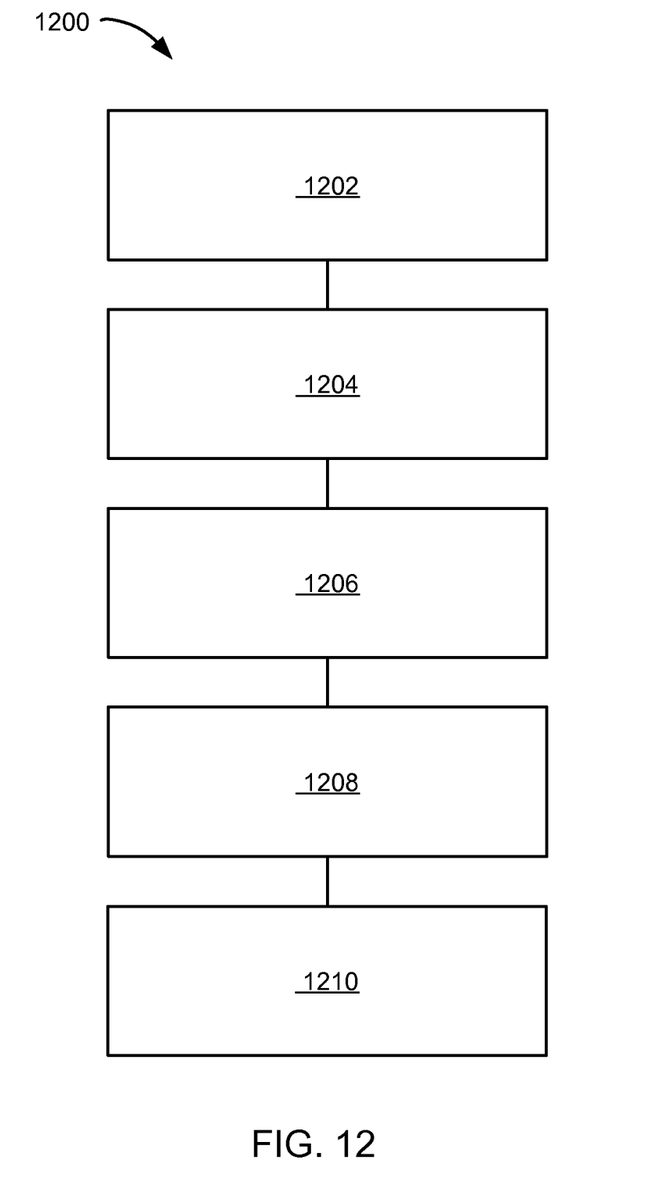
FIG. 12 is a flow chart of a method of manufacture of an integrated circuit packaging system in a further embodiment of the present invention.

Referring now to FIG. 12, therein is shown a flow chart of a method 1200 of manufacture of an integrated circuit packaging system in a further embodiment of the present invention. The method 1200 includes: forming a package paddle and a terminal adjacent to the package paddle in a block 1202; mounting a stack paddle over the package paddle with the stack paddle at a non-center offset with the package paddle and with a stacking adhesive in a block 1204; connecting a stack integrated circuit with the stack paddle, the terminal, the package paddle in a block 1206; mounting the stack integrated circuit over the stack paddle in a block 1208; and encapsulating the stack integrated circuit and the stack paddle with the package paddle exposed in a block 1210.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherofore set forth herein or shown in the accompanying drawings are to be interpreted in an illustrative and non-limiting sense.

What is claimed is:

1. A method of manufacture of an integrated circuit packaging system comprising:
    forming a package paddle and a terminal adjacent to the package paddle, wherein forming the package paddle includes:
        forming a first paddle and a second paddle; and
        isolating the first paddle from the second paddle for providing a first reference source with the first paddle and for providing a second reference source with the second paddle;
    attaching a stack paddle directly to the package paddle with a first stack adhesive, wherein the stack paddle is offset from a center of the package paddle;
    mounting a first base integrated circuit directly to the package paddle with a first adhesive, wherein the first base integrated circuit is adjacent to the stack paddle and offset from the center of the package paddle;
    mounting a second base integrated circuit directly to the first base integrated circuit with a second adhesive;
    connecting a stack integrated circuit with the stack paddle, the terminal, the package paddle, or a combination thereof;
    mounting the stack intergrated circuit directly over the stack paddle with a second stack adhesive; and
    encapsulating the package paddle, the stack intergrated circuit, the stack paddle, the first base integrated circuit, and the second base integrated circuit with the package paddle partially exposed.

2. The method as claimed in claim 1 further comprising:
    connecting the first base integrated circuit and the stack integrated circuit, the stack paddle, the terminal, the package paddle, or a combination thereof.

3. The method as claimed in claim 1 further comprising:
    connecting the second base integrated circuit and the stack integrated circuit, the stack paddle, the terminal, the package paddle, or a combination thereof.

4. The method as claimed in claim 1 wherein attaching the stack paddle directly to the package paddle with the first stack adhesive includes electrically isolating the stack paddle and the package paddle.

5. The method as claimed in claim 1 wherein attaching the stack paddle directly to the package paddle with the first stack adhesive includes attaching the stack paddle directly to the package paddle with a non-conductive adhesive.

6. An integrated circuit packaging system comprising:
    a package paddle, wherein the package paddle includes:
        a first paddle; and
        a second paddle adjacent to and isolated from the first paddle for providing a first reference source with the first paddle and for providing a second reference source with the second paddle;
    a terminal adjacent to the package paddle;
    a first stack adhesive directly on the package paddle;
    a stack paddle directly attached to the package paddle with the first stack adhesive, the stack paddle offset from a center of the package paddle;
    a first base integrated circuit directly attached to the package paddle with a first adhesive, the first base integrated circuit adjacent to the stack paddle and offset from the center of the package paddle;
    a second base integrated circuit directly attached to the first base integrated circuit with a second adhesive;
    a stack integrated circuit direct attached to the stack paddle with a second stack adhesive; and
    an encapsulation molded directly on the package paddle, the stack integrated circuit, the stack paddle, the first base integrated circuit, and the second base integrated circuit.

7. The system as claimed in claim 6 wherein the stack integrated circuit is connected to the stack paddle, the terminal, the package paddle, or a combination thereof.

8. The system as claimed in claim 6 wherein the package paddle is exposed from the encapsulation.

9. The system as claimed in claim 6 wherein:
    the stack integrated circuit is connected to the stack paddle, the terminal, the package paddle, or a combination thereof; and
    the package paddle is exposed from the encapsulation.

10. The system as claimed in claim 6 wherein the first base integrated circuit is connected to the stack integrated circuit, the stack paddle, the terminal, the package paddle, or a combination thereof.

11. The system as claimed in claim 6 wherein the second base integrated circuit is connected to the stack integrated circuit, the stack paddle, the terminal, the package paddle, or a combination thereof.

12. The system as claimed in claim 6 wherein the stack paddle is electrically isolated from the package paddle.

13. The system as claimed in claim 6 wherein the first stack adhesive includes a non-conductive adhesive.

* * * * *